United States Patent
Mar et al.

(10) Patent No.: US 6,664,904 B2
(45) Date of Patent: Dec. 16, 2003

(54) METHOD AND DEVICE FOR RECOVERING RLL CONSTRAINED DATA TO BE DECODED

(75) Inventors: William Mar, Taipei (TW); Luke Wen, Taipei (TW)

(73) Assignee: Via Optical Solution, Inc. (TW)

( * ) Notice: Subject to any disclaimer, the term of this patent is extended or adjusted under 35 U.S.C. 154(b) by 0 days.

(21) Appl. No.: 10/208,563

(22) Filed: Jul. 30, 2002

(65) Prior Publication Data

US 2003/0179115 A1 Sep. 25, 2003

(30) Foreign Application Priority Data

Mar. 19, 2002 (TW) .................................. 91105235 A

(51) Int. Cl.$^7$ ................................................. H03M 7/00
(52) U.S. Cl. ............................. 341/59; 341/50; 341/58; 341/94; 341/102; 341/103; 341/107
(58) Field of Search ............................... 341/59, 58, 50, 341/94, 102, 103–107

(56) References Cited

U.S. PATENT DOCUMENTS

| | | | | |
|---|---|---|---|---|
| 4,684,921 A | * | 8/1987 | Fok et al. ...................... | 341/59 |
| 4,800,441 A | * | 1/1989 | Sato ...................... | 358/426.12 |
| 5,198,813 A | * | 3/1993 | Isozaki ...................... | 341/59 |
| 5,579,003 A | * | 11/1996 | Hirayama et al. ............. | 341/59 |
| 5,600,315 A | * | 2/1997 | Shimpuku et al. ............. | 341/59 |
| 5,638,065 A | * | 6/1997 | Hassner et al. ................ | 341/59 |
| 5,748,119 A | * | 5/1998 | Ko ............................ | 341/59 |
| 5,933,103 A | * | 8/1999 | Kim ............................ | 341/59 |
| 6,268,810 B1 | * | 7/2001 | Shim et al. .................... | 341/59 |
| 6,356,595 B1 | * | 3/2002 | Czaja et al. .................. | 375/262 |
| 6,404,355 B1 | * | 6/2002 | Coene ......................... | 341/59 |
| 6,510,248 B1 | * | 1/2003 | Hsieh ......................... | 382/233 |
| 6,573,845 B2 | * | 6/2003 | Pozidis ......................... | 341/59 |
| 6,597,295 B1 | * | 7/2003 | Fukuyama ..................... | 341/58 |

* cited by examiner

Primary Examiner—Michael Tokar
Assistant Examiner—Linh Van Nguyen
(74) Attorney, Agent, or Firm—Madson & Metcalf

(57) ABSTRACT

A method for recovering a data required to have n consecutive and repetitive bits is disclosed. The data is obtained by converting a sample value sequence into a binary sequence according to a preset value and the data having n–1 consecutive first-level bits and two second-level bits immediately adjacent to two end bits of the n–1 consecutive first-level bits, respectively. The method corrects one of the two second-level bits, which has a corresponding sample value closer to the preset value than the other, into another first-level bit to obtain n consecutive first-level bits. In addition, a device for recovering a data to be decoded is also disclosed.

21 Claims, 5 Drawing Sheets

| Input : Bn, Xn | | Output : Yn |
|---|---|---|
| Bn: 000_0110_000<br>Xn: X1   X2 | $X_1 > X_2$: 000_1110_000<br>$X_1 < X_2$: 000_0111_000 | |
| Bn: 111_1001_111<br>Xn: X1   X2 | $X_1 < X_2$: 111_0001_111<br>$X_1 > X_2$: 111_1000_111 | |
| Bn: 111_010_111 | 111_000_111 | |
| Bn: 000_101_000 | 000_111_000 | |
| Bn: Other | Bn | |

Fig.5

METHOD AND DEVICE FOR RECOVERING RLL CONSTRAINED DATA TO BE DECODED

FIELD OF THE INVENTION

The present invention relates to a method for recovering data to be decoded, and more particularly to a method for recovering nT run length limited (RLL) constrained data to be decoded to user data. The present invention also relates to a device for recovering nT RLL constrained data.

BACKGROUND OF THE INVENTION

Computer storage systems (such as optical, magnetic, and the like) record digital data onto the surface of a storage medium, which is typically in the form of a rotating magnetic or optical disc, by altering a surface characteristic of the disc. The digital data serves to modulate the operation of a write transducer (write head) which records binary sequences onto the disc in radially concentric or spiral tracks. When reading this recorded data, a read transducer (read head), positioned in close proximity to the rotating disc, detects the alterations on the medium and generates a sequence of corresponding pulses in an analog read signal. These pulses are then detected and decoded by read channel circuitry in order to reproduce the digital sequence.

Detecting and decoding the pulses into a digital sequence can be performed by a simple peak detector in a conventional analog read channel or, as in more recent designs, by a discrete time sequence detector in a sampled amplitude read channel. Discrete time sequence detectors are preferred over simple analog pulse detectors because they compensate for intersymbol interference (ISI) and are less susceptible to channel noise. Consequently, discrete time sequence detectors increase the capacity and reliability of the storage system. There are several well known discrete time sequence detection methods including discrete time pulse detection (DPD), partial response (PR) with Viterbi detection, maximum likelihood sequence detection (MLSD), decision-feedback equalization (DFE), enhanced decision-feedback equalization (EDFE), and fixed-delay tree-search with decision-feedback (FDTS/DF).

When transmitting data or, for example, storing data on a magnetic disk, optical disk, magneto optic disk, or other storage medium, the data is modulated so as to make it suitable for the transmission or storage. An nT run length limited (nT RLL) code is known as one of such modulating codes, wherein T is the bit interval of a channel bit series (storage waveform series) and nT is the minimum inversion interval. In other words, nT RLL encoding constrains to n the minimum number of "0" or "1" consecutive bits appearance before inverting to bit "1" or "0".

Please refer to FIG. 1 which is a partial functional block diagram illustrating a conventional optical pickup device. An analog read signal V outputted from a pickup head is processed by a signal processing device that includes a variable gain amplifier 10, an analog-to-digital converter 11, a retiming system 12 and a gain control feedback device 13. The variable gain amplifier 10 adjusts the amplitude of the analog read signal V, and an analog filter (not shown) provides initial equalization toward the desired response as well as attenuating aliasing noise. The analog-to-digital converter 11 asynchronously samples the equalized analog read signal from the analog filter at a time interval T. The asynchronous sample values are applied to the gain control feedback device 13 through and to the retiming system 12 for adjusting the amplitude of the analog read signal V and the frequency and phase of the asynchronous sample values, respectively. The retiming system 12 thus generates synchronous samples Xn. The synchronous samples Xn are then input into a discrete time sequence detector 14, such as a maximum likelihood (ML) Viterbi sequence detector, which detects an estimated binary sequence Bn from the synchronous sample values. A 3T RLL decoder 15, such as a table mapping demodulator, decodes the estimated binary sequence Bn from the sequence detector 14 into estimated user data.

According to the 3T RLL encoding format, essentially single and double repetitive bits are not allowed, i.e. a minimum of three consecutive bits of "0"s or "1"s is required. Hence, when the binary sequences 111_010_111 and 000_101_000 appear, the binary sequences will be automatically corrected into 111_000_111 and 000_111_000, respectively, thereby recovering the bit data. However, when the following situation happens, it is troublesome to recover data correctly. Please refer to FIG. 2 which is a diagram illustrating the waveform of the analog read signal V, the synchronous sample value sequence Xn and the estimated binary sequence Bn. A preset level Vr is used to determine corresponding high or low levels of the sampling values of the synchronous sample value sequence Xn so as to obtain the estimated binary sequence Bn. For the sample values of the sequence Xn larger than Vr, the corresponding bit values thereof are determined to be "1"s, and on the contrary, the bit values are "0"s for those sampling values smaller than the preset value Vr. Hence, when the estimated binary sequence Bn is 111_1001_111 as shown in FIG. 2, it is sure that there is an error in the sequence Bn because of its origination from the 3T RLL encoding format. The binary sequence Bn is supposed to be either 111_0001_111 or 111_1000_111. According to the conventional method, however, it cannot determine which sequence is the correct data.

Therefore, the purpose of the present invention is to develop a method and a device for recovering the correct nT RLL constrained data to deal with the above situations encountered in the prior art.

SUMMARY OF THE INVENTION

An object of the present invention is to provide a method and a device for recovering nT run length limited (RLL) constrained data to be correctly decoded in an nT RLL decoder.

According to an aspect of the present invention, there is provided a method for recovering a data required to have n consecutive and repetitive "0" and "1" bits. The data is obtained by converting a sample value sequence into a binary sequence according to a preset value and the data having n−1 consecutive first-level bits and two second-level bits immediately adjacent to two end bits of the n−1 consecutive first-level bits, respectively. The method corrects one of the two second-level bits, which has a corresponding sample value closer to the preset value than the other, into another first-level bit to obtain n consecutive first-level bits.

In an embodiment, the first-level bit is bit "1" and the second-level bit is bit "0".

In another embodiment, the first-level bit is bit "0" and the second-level bit is bit "1".

For example, the preset value can be zero.

For example, n can be equal to 3.

According to another aspect of the present invention, there is provided a device for recovering a data including n−1 consecutive first-level bits with two second-level bits immediately adjacent to two end bits of the n−1 consecutive first-level bits to a data including n consecutive first-level bits. The device includes a first storing device for storing an analog signal sequence including n sample values, a second storing device for storing a binary sequence that is converted from the sample value sequence according to a preset value so as to include the n−1 consecutive first-level bits with the two second-level bits, and a comparative bit detector electrically connected to the first and second storing devices, and correcting one of the two second-level bits in the second storing device, which has a corresponding sampling value in the first storing device closer to the preset value than the other, into another first-level bit to obtain n consecutive first-level bits.

According to a further aspect of the present invention, there is provided a data-recovering device for recovering nT RLL constrained data that is to be used in an nT RLL decoder. The data-recovering device includes a first storing device for storing a sampling value sequence including a plurality of sample values, a second storing device for storing a binary sequence that is converted from the sampling value sequence according to a preset value, and a comparative bit detector electrically connected to the first and second storing devices for detecting whether a specific pattern of n−1 consecutive and repetitive bits with a preceding and a following bits different from the n−1 consecutive and repetitive bits exists in the second storing device, and correcting one of the preceding and following bits, which has a corresponding analog signal in the first storing device closer to the preset value than the other, to be identical to the n−1 consecutive and repetitive bits when the specific pattern is detected.

Preferably, the first and second data storing devices are a first and a second first-in first-out buffers, respectively. In an embodiment, the first and second first-in first-out buffers are a first and a second shift registers, respectively.

Preferably, the first shift register comprises n+1 register units for storing therein n+1 sample values and the comparative bit detector includes a comparator electrically connected to the first one and the last one of the n+1 register units for comparing two end ones of the n+1 sample values with each other, and outputting a correcting signal with the information that which register unit stores therein the sample value closer to the preset value than the other, and a detecting and correcting device electrically connected to the comparator and the second shift register for detecting the specific pattern, and correcting the preceding or the following bit in the second shift register in response to the correcting signal.

Preferably, n is equal to 3.

BRIEF DESCRIPTION OF THE DRAWINGS

The present invention may best be understood through the following description with reference to the accompanying drawings, in which:

FIG. 5 is a table illustrating an example for recovering an nT RLL constrained data to be decoded by a 3T RLL decoder according to the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
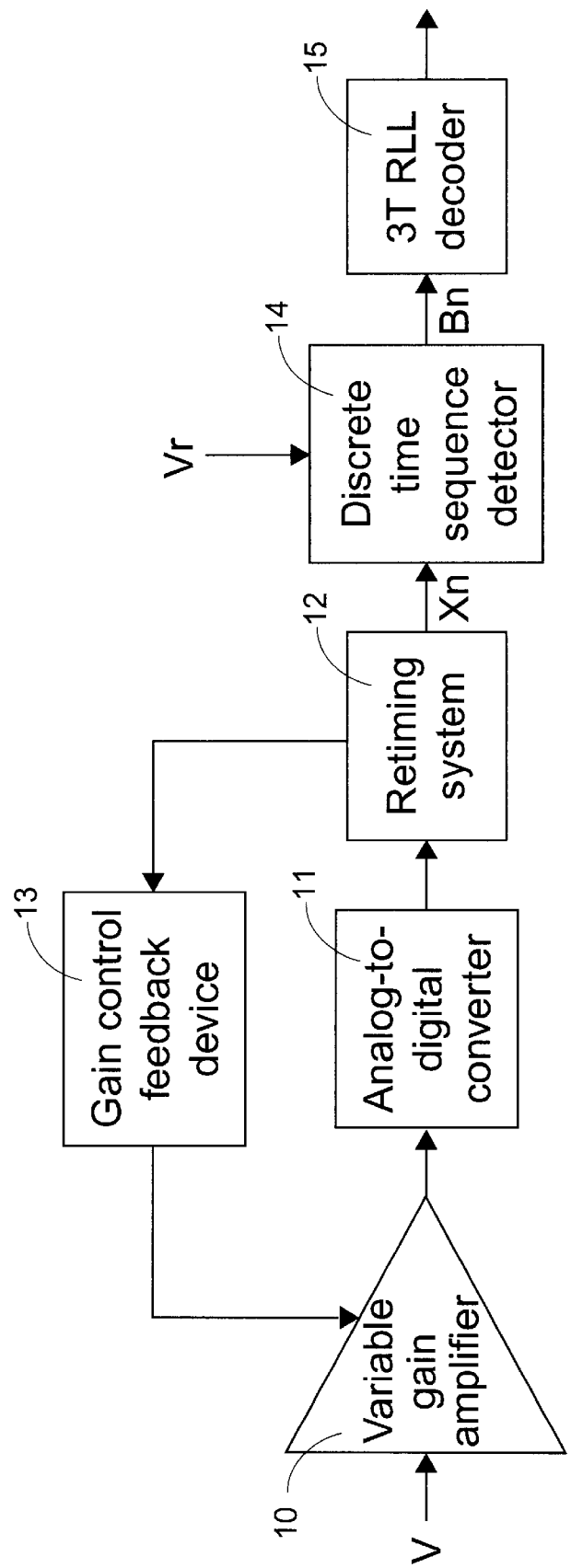
FIG. 1 is a partial functional block diagram illustrating a conventional RLL constrained data recovering process for use in an optical pickup device.
Figure 2:
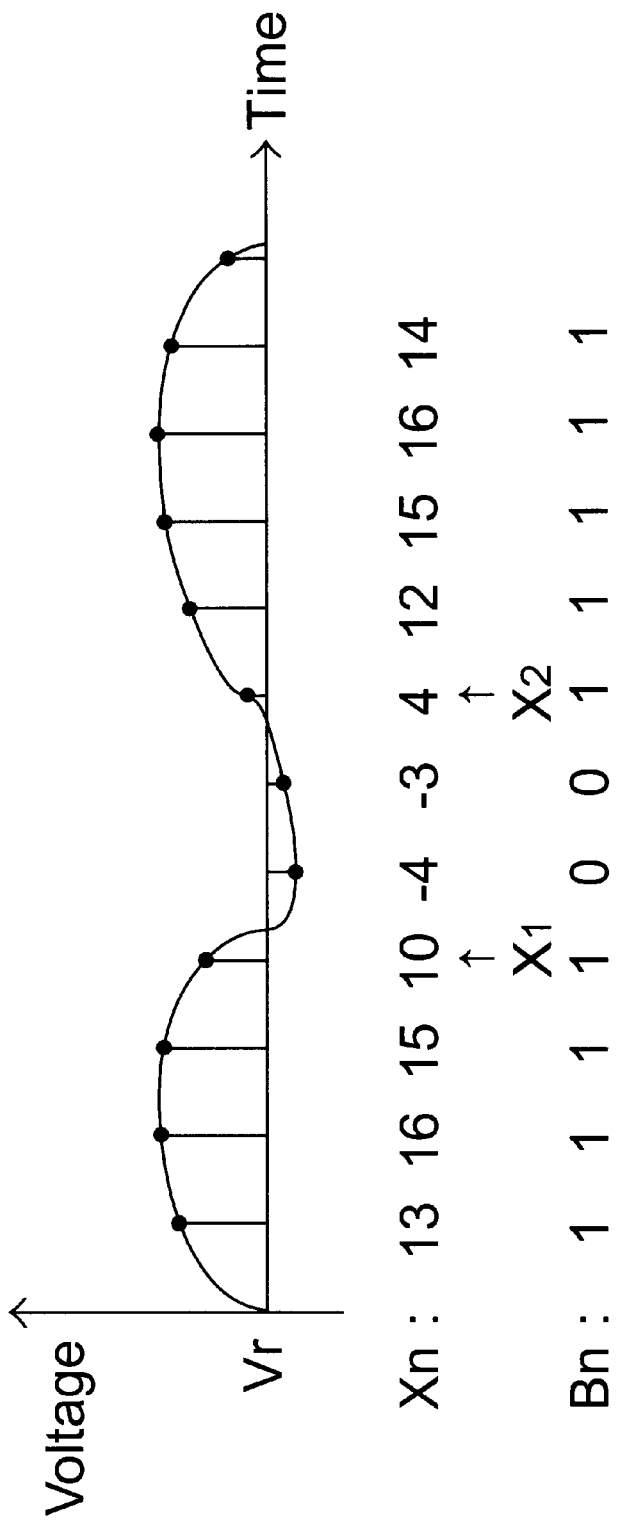
FIG. 2 is a diagram illustrating the relationship among an analog read signal V, a sample value sequence Xn and a binary sequence Bn.
Figure 3:
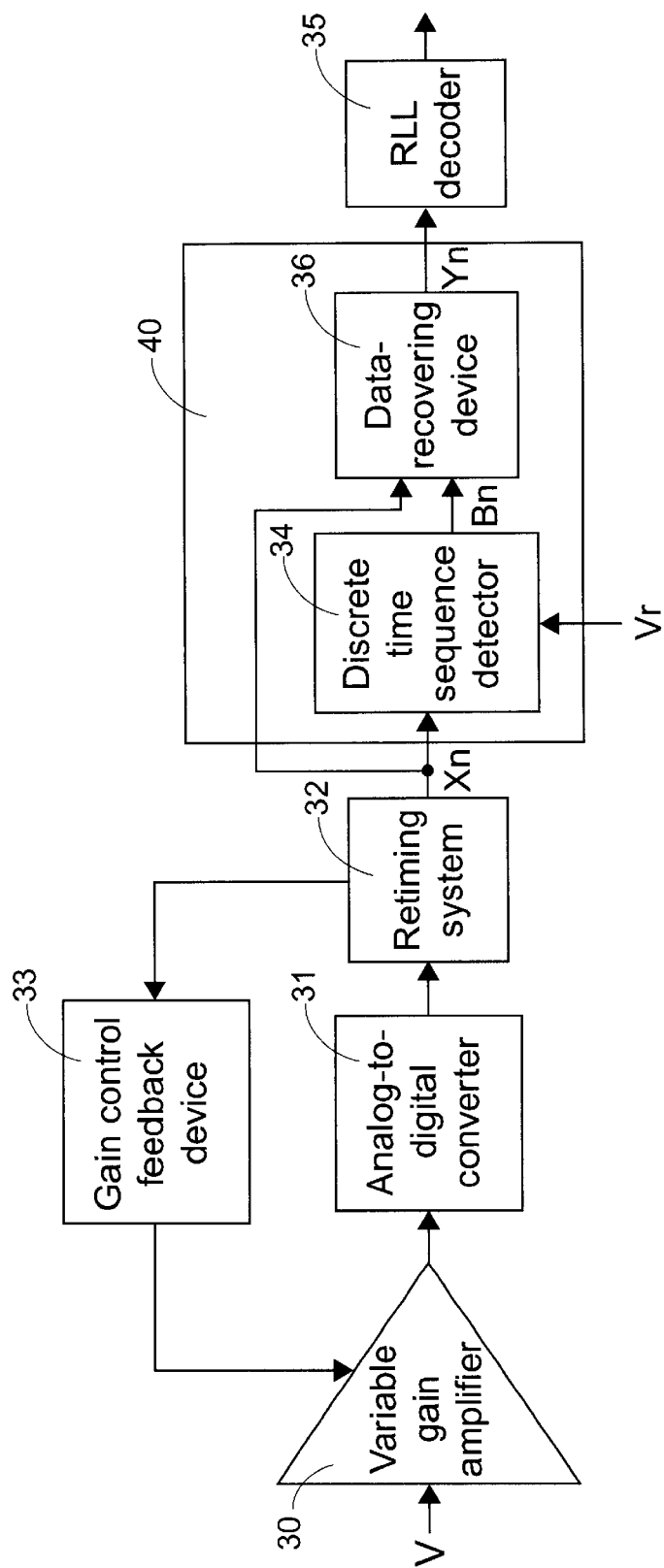
FIG. 3 is a partial functional block diagram illustrating a user data recovering process according to a preferred embodiment of the present invention.

Please refer to FIG. 3, a partial functional block diagram illustrating a user data recovering process for use in an optical pickup device according to a preferred embodiment of the present invention. The optical pickup device of the present embodiment is similar to the conventional one shown in FIG. 1 except that the optical pickup device of the present invention further includes a data-recovering device 36 in addition to a signal processing device including a variable gain amplifier 30, an analog-to-digital converter 31, a retiming system 32 and a gain control feedback device 33, a discrete time sequence detector 34 and a RLL decoder 35. The data-recovering device 36 is placed in between the discrete time sequence detector 34 and the RLL decoder 35. The construction and operation of the data-recovering device 36 along with the discrete time sequence detector 34, which is indicated by a numeral reference 40 herein, will be described later with reference to FIG. 4.

An analog read signal V is first emanating from a read head positioned over a storage medium, which is then received by the signal processing device and converted into a synchronous sample value sequence Xn. The discrete time sequence detector 32 takes the synchronous sample value sequence Xn as its input and transforms the synchronous sample value sequence Xn into a binary sequence Bn according to a preset value Vr. Moreover, blocks within the signal processing device that eventually produces the synchronous sample value sequence Xn function as follow: the variable gain amplifier 30 takes in the analog read signal V for adjusting the amplitude of the analog read signal V; the analog-to-digital converter 31 samples the analog read signal V asynchronously after the amplitude adjustment and produces an asynchronous sample value sequence; the retiming system 32 adjusts the frequency and phase of the asynchronous sample value sequence, thus produces the synchronous sample value sequence Xn. Furthermore, the gain control feedback device 33 feeds back from the retiming system 32 to the variable gain amplifier 30 for readjusting the amplitude of the analog read signal V. The architecture of the signal processing device is certainly not restricted to what has been described, it can have more or less building blocks and arrange in different ways, as long as it generates a sample value sequence.

And again, after the analog read signal V is processed by the signal processing device, the resulting synchronous sample value sequence Xn including a plurality of sampling values is received by the discrete time sequence detector 34. Subsequently, each of the sampling values in the synchronous sample value sequence Xn is converted to a corresponding binary bit according to the preset value Vr, for example a zero value, to form the binary sequence Bn. Whereas, for the sample values of the sequence Xn larger than Vr, the corresponding bit values thereof are determined to be "1"s, and on the contrary, the bit values are "0"s for those sampling values smaller than the preset value Vr. The nT run length limited (RLL) format, for which essentially less than n repetitive bits are not allowed, needs a minimum of n "0" or "1" consecutive bits. Thus, there requires at least n consecutive "0" and/or n consecutive "1" bits in the binary sequence Bn. When the binary sequence Bn includes only n−1 consecutive and repetitive bits, and another two bits immediately adjacent to the two end bits of the n−1 consecutive and repetitive bits are both different form the bits therebetween, one of the two alien bits is corrected by the data-recovering device 36 to produce n consecutive and repetitive bits to comply with the requirement of nT RLL format.

Figure 4:
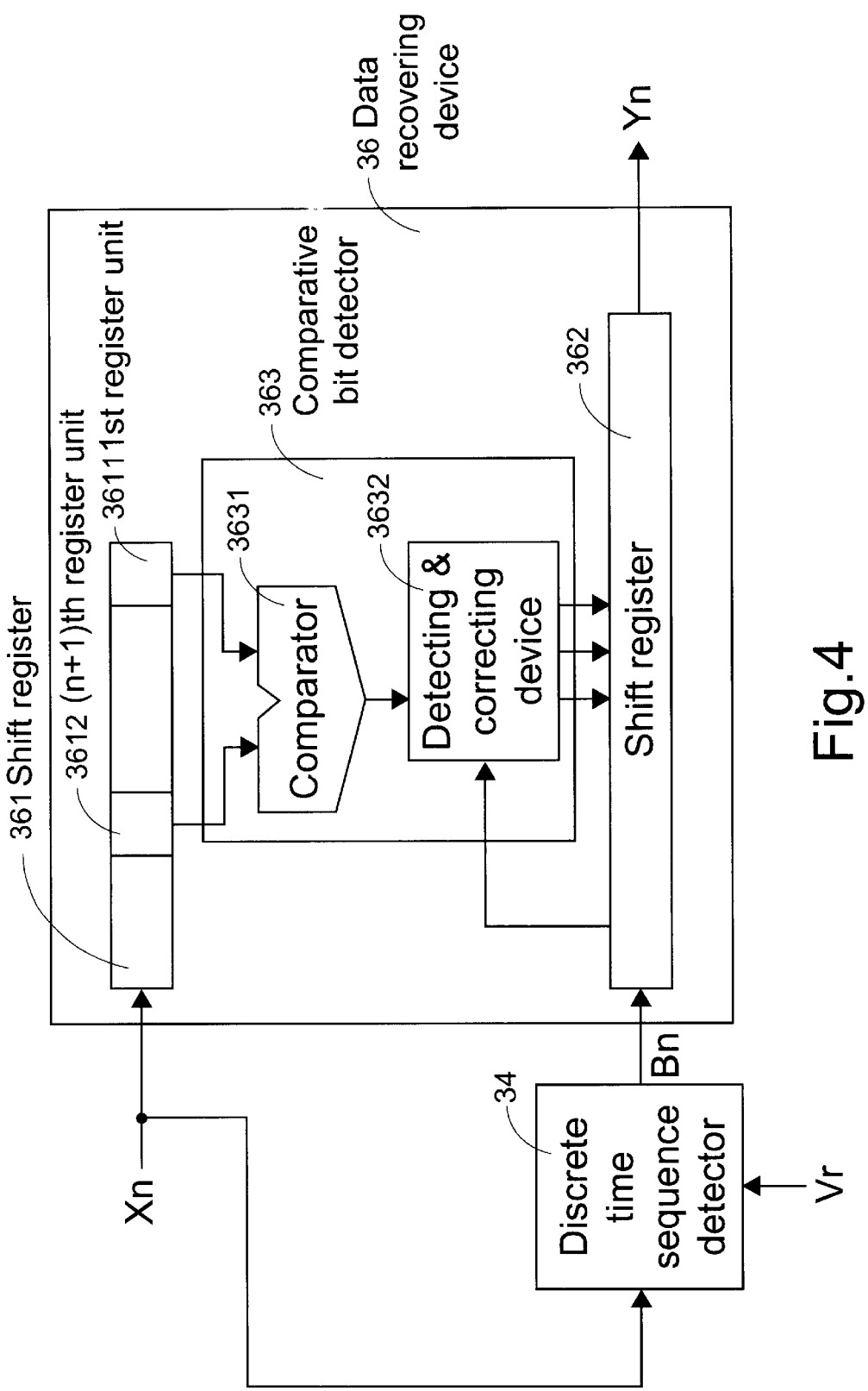
FIG. 4 is a schematic functional block diagram illustrating a preferred embodiment of a device for recovering an nT RLL constrained data to be decoded according to the present invention.

Now referring to FIG. 4, a schematic functional block diagram illustrating a preferred embodiment of the data-recovering device 36 of the present invention. The data-recovering device 36 includes two first-in first-out (FIFO) buffers 361 and 362, and a comparative bit detector 363. In this embodiment, the FIFO buffers are implemented by shift registers. The first shift register 361 is used for receiving and storing the sample values of the synchronous sample value sequence Xn and outputting them in an order. After the synchronous sample value sequence Xn is converted into the binary sequence Bn according to the preset value Vr through the discrete time sequence detector 34, the resulting binary sequence Bn is received by and stored in the second shift register 362, and outputted in an order.

The comparative bit detector 363, electrically coupled in between the shift registers 361 and 362, includes a comparator 3631 and a detecting and correcting device 3632. The comparator 3631 is electrically coupled to the first register unit 3611 and the (n+1)th register unit 3612 of the first shift register 361, and the detecting and correcting device 3632 is electrically coupled to the second shift register 362. When the detecting and correcting device 3632 detects that the binary bits corresponding to the sampling values stored in the second to the nth register units of the first shift register 361 are the same, and the preceding and following bits corresponding to the sampling values stored in the first and the (n+1)th register units of the first shift register 361 are identical to each other but different from the bit values therebetween, the comparator 3631 then compares the sample values stored in the first and the (n+1)th register units of the first shift register 361 with each other according to the preset value Vr used for the conversion of the synchronous sample value sequence Xn to the binary sequence Bn. In response to the comparison result, a correcting signal is outputted to have one of the preceding and following bit values corresponding to the compared sample values, respectively, corrected into the value identical to the middle ones. It is the bit value corresponding to a sample value closer to the preset value Vr to be corrected. For example, when the preset value Vr is at zero level, and the sample values stored in the register units 3611 and 3612 are "10" and "4", respectively, a correcting signal of a low level is outputted to correct the bit value corresponding to the sampling value stored in the register unit 3612 because "4" is closer to zero than "10". On the contrary, when the sample values stored in the register units 3611 and 3612 are "−2" and "−4", respectively, a correcting signal of a high level is outputted to have the bit value corresponding to the sample value stored in the register unit 3611 corrected because "−2" is closer to "0" than "−4". Then, a corrected binary sequence Yn including n consecutive and repetitive bits is outputted for the subsequent decoding process, that is, through the RLL decoder 35 (shown in FIG. 3) to estimate the user data which is encoded in the nT RLL coding format and stored on the storage medium.

Please refer to FIG. 5, a table illustrating an example for recovering data to be decoded by a 3T RLL (where n equals to 3 here) decoding process according to the present invention. FIG. 5 shows how the input Bn of the data recovering device 36 is converted into the output Yn according to another input Xn. When the binary sequence Bn consists of 000_0110_000, which apparently involves an error because two consecutive bits "1" exist (less than three bits), it is desirably to be corrected into 000_1110_000 or 000_0111_000 depending on the corresponding values X1 and X2 of the synchronous sample sequence Xn. The output binary sequence Yn will be 000_1110_000 if the sample value X1 is larger than X2, and be 000_0111_000 when X1 is smaller than X2. Similarly, in the case that the binary sequence Bn consists of 111_1001_111, it will be corrected into 111_0001_111 when the sample value X1 is smaller than X2, and 111_1000_111 when X1 is larger than X2, thereby recovering 3T RLL data to be correctly decoded.

As to recapture the features of the present invention, a method for recovering an nT RLL coding-format data of the present invention includes: first, receiving the sample value sequence Xn; second, converting the sample value sequence Xn into the binary sequence Bn in response to the preset value Vr, wherein the binary sequence Bn includes n−1 consecutive first-level bits and a second-level bit immediately adjacent to each of two end bits of the n−1 consecutive first-level bits; third, detecting the presence of the n−1 consecutive first-level bits and the second-level bit immediately adjacent to each of two end bits of the n−1 consecutive first-level bits; fourth, comparing the sample values of the second-level bits immediately adjacent to two end bits of the n−1 consecutive first-level bits; and last, correcting one of the two second-level bits, which has a corresponding sample value closer to the preset value than the other, into another first-level bit to obtain n consecutive first-level bits.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for recovering an nT RLL coding-format data comprising:

receiving a sample value sequence;

converting said sample value sequence into a binary sequence in response to a preset value;

detecting the presence of a specific binary sequence that includes n−1 consecutive first-level bits and two second-level bits, one immediately adjacent to each of the two end bits of said n−1 consecutive first-level bits;

comparing two sample values in said sample value sequence respectively corresponding to said two second-level bits of said specific binary sequence; and correcting one of said two second-level bits, which has a corresponding sample value closer to said preset value than the other, into another first-level bit to obtain n consecutive first-level bits.

2. The method according to claim 1 wherein said first-level bit is bit "1" and said second-level bit is bit "0".

3. The method according to claim 1 wherein said first-level bit is bit "0" and said second-level bit is bit "1".

4. The method according to claim 1 wherein said preset value is zero.

5. The method according to claim 1 wherein n is equal to 3.

6. A device for recovering an nT RLL coding-format data from a data sequence having less than n consecutive first-level bits with two second-level bits, one immediately adjacent to each of the two end bits of said less than n consecutive first-level bits, said device comprising:

first storing means for storing a sample value sequence;

second storing means for storing a binary sequence that is converted from said sample value sequence according to a preset value so as to include said less than n consecutive first-level bits and said two second-level bits; and bit correcting means electrically coupled in between said first and second storing means for correcting one of said two second-level bits in said second storing means, which has a corresponding sample value stored in said first storing means closer to said preset value than the other, into another first-level bit to obtain n consecutive first-level bits.

7. The device according to claim 6 wherein said first and second storing means are first-in first-out (FIFO) buffers.

8. The device according to claim 6 wherein said first-level bit is bit "0" and said second-level bit is bit "1", or said first-level bit is bit "1" and said second-level bit is bit "0".

9. The device according to claim 6 wherein said preset value is zero.

10. The device according to claim 6 wherein n is equal to 3.

11. The device according to claim 6 wherein said bit correcting means comprises:

a comparator electrically coupled to a first storing unit and a second storing unit of said first storing means with other n storing units between said first and second storing units for comparing sample values stored in said first and second storing units, and generating a correcting signal having an information indicating which one of said first and second storing units stores therein a sample value closer to said preset value than the other; and a detecting and correcting device electrically coupled in between said comparator and said second storing means for receiving said correcting signal, and correcting one of said two second-level bits in said second storing means in response to said correcting signal.

12. A data-recovering device for use in recovering nT RLL constrained data, comprising:

a first storing device for storing a sample value sequence having a plurality of sample values;

a second storing device for storing a binary sequence that is converted from said sample value sequence according to a preset value; and a comparative bit detector electrically coupled in between said first and second storing devices for detecting whether a specific pattern of n−1 consecutive and repetitive bits with a preceding and a following bit different from said n−1 consecutive and repetitive bits exists in said second storing device, and correcting one of said preceding and following bits, which has a corresponding sample value stored in said first storing device closer to said preset value than the other, to be identical to said n−1 consecutive and repetitive bits when said specific pattern is detected.

13. The device according to claim 12 wherein said first and second data storing devices are first-in first-out (FIFO) buffers.

14. The device according to claim 13 wherein said first-in first-out buffers are shift registers.

15. The device according to claim 14 wherein said first data storing device comprises n+1 register units for storing therein n+1 sample values, and said comparative bit detector comprises:

a comparator electrically coupled to a first and a last register units of said n+1 register units for comparing the sample values stored in said first and last register units, and generating a correcting signal having an information indicating which register unit stores therein said sample value closer to said preset value than the other; and a detecting and correcting device electrically coupled in between said comparator and said second data storing device for detecting said specific pattern, and correcting said preceding or said following bit in said second shift register in response to said correcting signal.

16. The device according to claim 12 wherein n is equal to 3.

17. A user data estimator for estimating an nT RLL constrained data stored on a storage medium from an analog read signal emanating from a read head positioned over the medium, said data estimator comprising:

a signal processing device converting said analog read signal into a synchronous sample value sequence;

a discrete time sequence detector transforming said synchronous sample value sequence into a binary sequence according to a preset value;

a data recovering device receiving said synchronous sample value sequence and said binary sequence for generating a corrected binary sequence in an nT RLL coding format, said data recovering device detecting whether a specific pattern of n−1 consecutive and repetitive bits with a preceding and a following bit different from said n−1 consecutive and repetitive bits exists in said binary sequence, and correcting one of said preceding and following bits, which has a corresponding sample value in said synchronous sample value sequence closer to said preset value than the other, to be identical to said n−1 consecutive and repetitive bits when said specific pattern is detected; and a decoder responsive to said corrected binary sequence for estimating user data which is encoded in said nT RLL coding format and stored on said storage medium.

18. The user data estimator according to claim 17 wherein said signal processing device comprises:

a variable gain amplifier for adjusting the amplitude of said analog read signal;

a sampler sampling said analog read signal asynchronously after the amplitude adjustment and producing an asynchronous sample value sequence;

a retiming system adjusting the frequency and phase of said asynchronous sample value sequence to produce said synchronous sample value sequence; and a gain control feedback device feeding said synchronous sample value sequence back to said variable gain amplifier for readjusting the amplitude of said analog read signal.

19. The user data estimator according to claim 17 wherein said data recovering device comprises:

a first shift register for storing said synchronous sample value sequence; and a second shift register for storing said binary sequence.

20. The user data estimator according to claim 19 wherein said first shift register comprises n+1 register units for storing therein n+1 sample values, and said data recovering device further comprises:

a comparator electrically coupled to a first and a last register units of said n+1 register units for comparing the sample values stored in said first and last register units, and generating a correcting signal having an information indicating which register unit stores therein said sample value closer to said preset value than the other; and a detecting and correcting device electrically coupled in between said comparator and said second shift register for detecting said specific pattern, and correcting said preceding or said following bit in said second shift register in response to said correcting signal.

21. The user data estimator according to claim 17 wherein n is equal to 3.

* * * * *